United States Patent
Engelhard et al.

(12) 
(10) Patent No.: US 7,450,984 B2
(45) Date of Patent: Nov. 11, 2008

(54) LOCAL COIL ARRANGEMENT FOR A MAGNETIC RESONANCE SYSTEM

(75) Inventors: Karl Engelhard, Erlangen (DE); Rainer Kuth, Herzogenaurach (DE); Arne Reykowski, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 894 days.

(21) Appl. No.: 10/439,123

(22) Filed: May 15, 2003

(65) Prior Publication Data

US 2004/0002648 A1    Jan. 1, 2004

(51) Int. Cl.
*A61B 5/055* (2006.01)
*G01V 3/00* (2006.01)

(52) U.S. Cl. .................................. 600/422; 324/318
(58) Field of Classification Search ................. 600/421, 600/422; 324/318, 322
See application file for complete search history.

(56) References Cited

U.S. PATENT DOCUMENTS

| | | | |
|---|---|---|---|
| 4,793,356 A | 12/1988 | Misic et al. | |
| 4,816,765 A * | 3/1989 | Boskamp | 324/318 |
| 5,307,806 A | 5/1994 | Jones | |
| 5,435,302 A | 7/1995 | Lenkinski et al. | |
| 5,552,707 A * | 9/1996 | Takahashi et al. | 324/318 |
| 5,594,337 A * | 1/1997 | Boskamp | 324/318 |
| 6,157,193 A * | 12/2000 | Renz et al. | 324/318 |
| 6,585,673 B1 * | 7/2003 | Bass | 602/60 |
| 6,836,117 B2 * | 12/2004 | Tamura et al. | 324/318 |
| 7,177,671 B2 | 2/2007 | Nabetani | |

* cited by examiner

*Primary Examiner*—Eric F Winakur
*Assistant Examiner*—Helene Bor
(74) *Attorney, Agent, or Firm*—Schiff Hardin LLP

(57) ABSTRACT

A local coil arrangement for a magnetic resonance system has an antenna arrangement that is arranged in a retainer structure. The retainer structure has a waistband and a perineum element. A person to be examined dons the local coil arrangement like trousers.

12 Claims, 2 Drawing Sheets

LOCAL COIL ARRANGEMENT FOR A MAGNETIC RESONANCE SYSTEM

BACKGROUND OF THE INVENTION

1. Field of the Invention

The present invention is directed to a local coil arrangement for a magnetic resonance system of the type having an antenna arrangement that is arranged in a retainer structure.

2. Description of the Prior Art

Local coil arrangements of the above type are well known. For example, there are head coils, array coils, endorectal and endovaginal coils. U.S. Pat. No. 5,307,806 discloses a local coil arrangement for a magnetic resonance system that has an antenna arrangement that is arranged in a retainer structure.

U.S. Pat. No. 5,594,337 discloses different configurations of local coils in a flexible element that is adapted to the shape of the body, employed in angiography of the pelvis or of the feet. Retainer structures with a waistband are also employed.

U.S. Pat. No. 4,793,356 discloses a local coil arrangement for a magnetic resonance system that comprises an antenna arrangement arranged in a retainer structure. The retainer structure is fashioned as a ring that can be opened and closed.

A similar arrangement is described in U.S. Pat. No. 5,435,302.

Among other things, magnetic resonance examinations are also utilized for the diagnosis of prostate and cervical carcinoma. Conventionally, screenings or initial examinations usually ensue with the whole-body antenna of the magnetic resonance system. These examinations have the disadvantage of a poor image quality. It is therefore also known to utilize the aforementioned endorectal and endovaginal coils for more exact examinations. The utilization of these local coils is physically uncomfortable for the patient. Moreover, the employment of such local coils also may cause discomfort to the patient because articles must be introduced into the body in an intimate area and the intimate area must also be unclothed. Further, the local coils must either be disposed of or cleaned a complicated involved way after use.

SUMMARY OF THE INVENTION

An object of the present invention is to provide a local coil arrangement with which qualitatively high-grade exposures of the pelvic region, particularly the prostate and cervical region, can be made in a dependable way, and wherein the local coil arrangement is easy to handle and wherein neither the local coil arrangement nor parts thereof have to be introduced into the body of the examination subject.

This object is achieved in accordance with the invention in a local coil arrangement having the retainer structure with a waistband, and a perineum element, the retainer structure being configured so the examination subject can don the retainer structure like trousers, so the middle of the perineum element is adjacent the subject's perineum.

The local coil arrangement is specifically fashioned for examinations in the pelvic region, and has a larger reception field than endorectal and endovaginal coils, and with which an image is obtained having an image quality that is considerably better than the image quality obtainable with a whole-body coil. Further, the examination subject can don the local coil arrangement himself or herself, even over his/her clothing.

The examination subject is usually lying horizontally with his/her back on a support surface of the MR apparatus. Dependent on the design of the magnetic resonance system, the basic magnetic field of the magnetic resonance system extends in one of three basic directions, i.e. either perpendicularly in space or from the head to the feet of the patient (or in the opposite direction) or horizontally transverse relative to the patient, i.e. from left to right. Accordingly, the antenna arrangement can be alternatively fashioned such that it can acquire a magnetic resonance signal essentially in a plane proceeding parallel to the waistband, a magnetic resonance signal essentially in a plane parallel to the perineum element, or a magnetic resonance signal proceeding essentially in a plane proceeding. perpendicular to the waistband and perpendicular to the perineum element.

Dependent on the magnetic resonance signal to be acquired, the antenna arrangement has one or two of the following antenna elements:

a half-loop passing through the perineum element that has two half-loop ends and a connector ring that proceeds around essentially parallel to the waistband and connects the half-loop ends;

a hoop ring that proceeds around the subject essentially parallel to the waistband; and a basic perineum ring that extends from the waistband to the middle of the perineum element at one side of the perineum element.

As warranted, the local coil arrangement can include all three of the aforementioned antenna element when the reception signals to be interpreted can be dynamically set or adjusted during operation.

In an embodiment, in addition to the basic perineum ring, the antenna arrangement also has an auxiliary perineum ring extending from the waistband to the middle of the perineum element at the other side of the perineum element. Sensitivity for the magnetic resonance signal acquired by the perineum rings is thereby increased.

The perineum rings can be fashioned as a shared conductor loop crossing itself in the region of the middle of the perineum element, allowing the two perineum rings to be realized in an especially simply way.

The local coil arrangement can be especially flexibly employed when the waistband has a variable circumference. For realizing the variable circumference, for example, the waistband can be composed of elastic material and/or can be adjustably fashioned and/or can have at least one separating location at which it can be opened—preferably without tools—and the separating location can be bridged with a bridge element.

In an embodiment the antenna arrangement is closed liquid-tight at least in the region of the perineum element—and preferably everywhere—making the local coil arrangement suited for interventional examinations.

In a further embodiment the antenna arrangement is fashioned such that it can acquire a magnetic resonance signal that is circularly polarized in a rotational sense and cannot acquire a magnetic resonance signal circular polarized opposite this rotational sense. Such an arrangement exhibits an especially good signal-to-noise ratio. For acquiring only the magnetic resonance signal that is circularly polarized in a rotational sense, the antenna arrangement must be formed of two of the aforementioned antenna elements, the signals thereof being added phase-offset by 90° in a known way.

The antenna arrangement and the retainer structure can be composed of sterilizeable material, allowing the local coil arrangement to be reusable.

DESCRIPTION OF THE PREFERRED EMBODIMENTS

Figure 1:
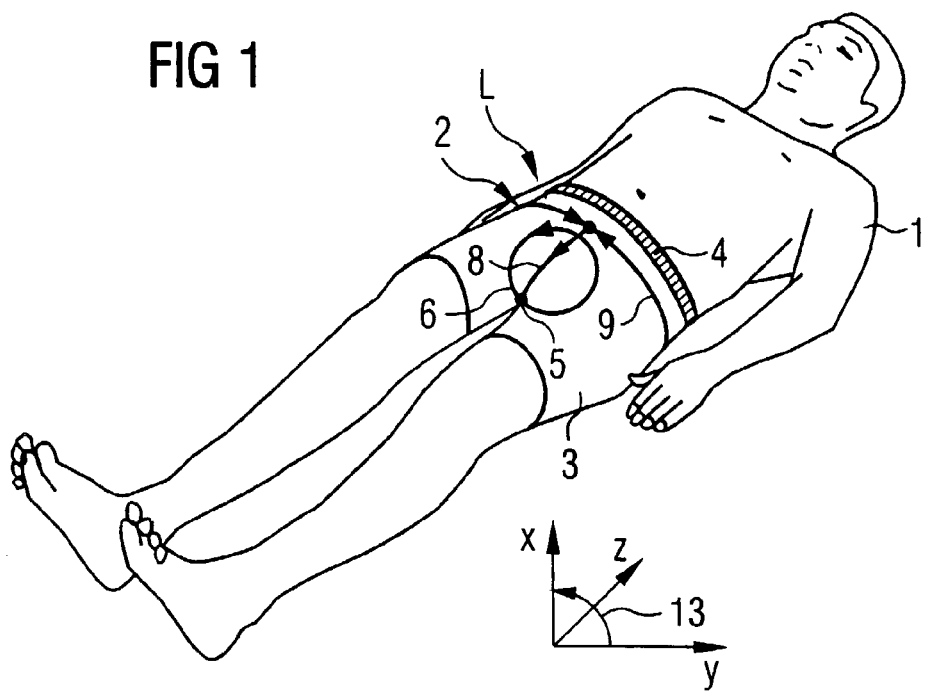
FIG. 1 illustrates a person to be examined wearing a local coil arrangement in accordance with the invention.

As shown in FIG. 1, an examination subject 1 has been prepped for a magnetic resonance examination of the pelvic region, for which purpose the subject 1 will be brought into an examination space of a magnetic resonance system (not shown).

The magnetic resonance system can have a basic magnetic field that extends in the direction of a Cartesian coordinate system z. As shown in FIG. 1, the direction z extends from the feet to the head of the subject 1.

MR signals arising from the pelvic region of the subject 1 are acquired with a local coil arrangement L. The local coil arrangement L has an antenna arrangement 2 that is arranged in a retainer structure 3. The retainer structure 3, as shown in FIG. 1 has a waistband 4 and a perineum element 5. The perineum element 5 extends from front to back at the perineum of the subject 1 and thus has a middle section in the perineum itself. The subject 1 can don the local coil arrangement L like trousers.

So that the excitation and the acquisition of the magnetic resonance signal are not influenced, the retainer structure 3 is composed of material that is electrically non-conductive, radiofrequency-transparent, magnetically transparent and, moreover, neutral in terms of magnetic resonance. Such materials are well known and are currently utilized in the standard local coil arrangements such as, for example, head coils, endorectal and endovaginal coils. Examples of such suitable materials are PE foam and PE film.

As already mentioned, the basic magnetic field according to FIG. 1 is oriented parallel to the direction z. The magnetic resonance signal is therefore a signal that is circularly polarized in a plane, the plane extending in the directions x, y. The antenna arrangement 2 of FIG. 1 therefore is fashioned such that it can acquire a magnetic resonance signal that proceeds in this plane. This plane is essentially parallel to the waistband 4.

Figure 2:
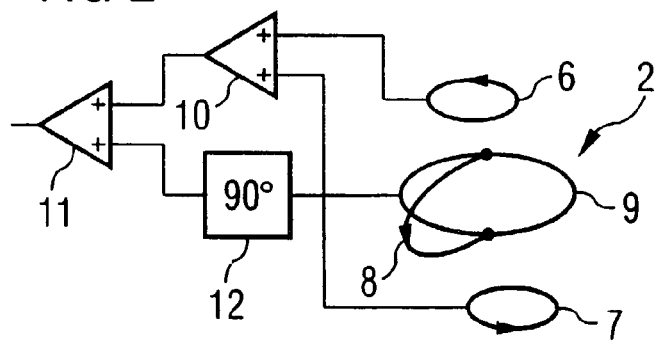
FIG. 2 is a circuit diagram of the inventive local coil arrangement.

For acquiring the component of the magnetic resonance signal that proceeds in the direction x, the antenna arrangement 2 according to FIGS. 1 and 2 has a basic perineum ring 6 and—see FIG. 2—an auxiliary perineum ring 7. The two perineum rings 6, 7 each extend from the waistband 4 to the middle section of the perineum element 5 at a respective sides of the perineum element 5.

For acquiring the component of the magnetic resonance signal in the direction y, the antenna arrangement 2 according to FIGS. 1 and 2 has a half-loop 8 with two half-loop ends. The half-loop ends are connected to one another via a connecting ring 9 that proceeds around and essentially parallel to the waistband 4.

Fundamentally, the magnetic resonance signals acquired by the perineum rings 6, 7 and the half-loop 8 can be conducted in separate reception channels and can be separately processed. As can be seen from FIG. 2, the signals of the two perineum rings 6, 7, however, are supplied to a summation element 10. The output signal of this summation element 10 is supplied to a further summation element 11. The further summation element 11 is also supplied with the signal of the half-loop 8 via a 90° phase shifter. The antenna arrangement 2 therefore is fashioned such that it can only acquire a magnetic resonance signal that is circularly polarized in a rotational sense 13. If, in contrast, the magnetic resonance signal is circularly polarized opposite the rotational sense 13, it cannot be acquired with the antenna arrangement 2.

Figure 3:
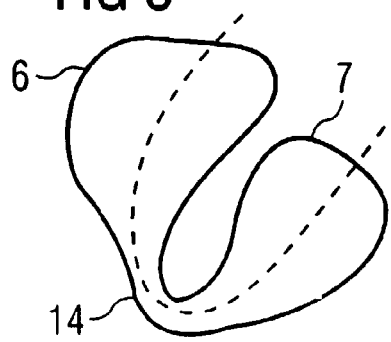
FIG. 3 shows a further embodiment of the perineum element in the inventive local coil arrangement.

FIG. 3 shows an alternative development of the perineum rings 6, 7. The half-loop 8 is indicated with broken lines in FIG. 3. As shown in FIG. 3, the perineum rings 6, 7 are fashioned as a common conductor loop 14 that crosses itself in the region of the middle section of the perineum element 5. As a result thereof, the sum signal of both perineum rings 6, 7 is immediately available, so that the summation element 10 (see FIG. 2) can be eliminated.

Figure 4:
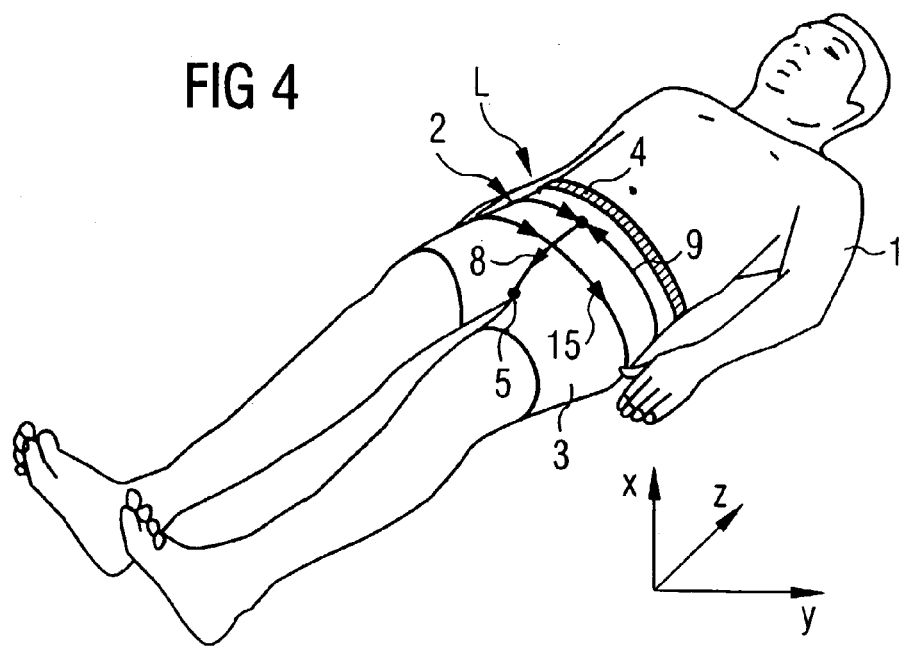
FIGS. 4-5 illustrate a person to be examined from FIG. 1 with further embodiments of the inventive local coil arrangements.

The illustration according to FIG. 4 essentially corresponds to that of FIG. 1. Differing from FIG. 1, however, the basic magnetic field proceeds parallel to the direction x in FIG. 4. The magnetic resonance signal therefore circulates in a plane that is defined by the directions y, z. Accordingly, the antenna arrangement 2 is fashioned in FIG. 4 such that it can acquire a magnetic resonance signal that proceeds in a plane perpendicular to the waistband 4 and perpendicular to the perineum element 5.

The antenna element 8, 9, with which the component in the direction y is detected, is fashioned just like that set forth above in conjunction with FIGS. 1 through 3. The acquisition also ensues in the same way. The above comments in conjunction with FIGS. 1 through 3 therefore also apply regarding the component of the magnetic resonance signal in the direction y.

For acquiring the component of the magnetic resonance signal in the direction z, in contrast, the antenna arrangement 2 has a collar ring 15 that proceeds around and essentially parallel to the waistband 4.

In the arrangement according to FIG. 4, it is also again possible—by means of 90° phase-offset addition of the signals acquired by the antenna elements 8, 9 and 15—to acquire only a magnetic resonance signal that is circularly polarized in a rotational sense and to not acquire a magnetic resonance signal circularly polarized opposite the rotational sense. The procedure is fundamentally the same as that described above in conjunction with FIGS. 1 through 3. This signal processing therefore need not be discussed again.

Figure 5:
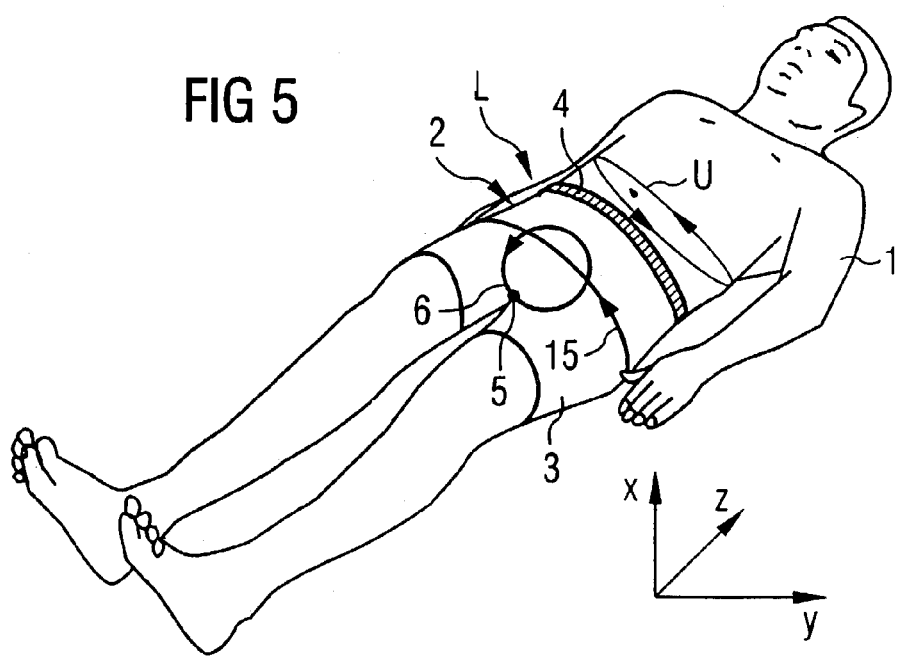

The illustration according to FIG. 5 also essentially corresponds to that of FIG. 1. In FIG. 5, however, the basic magnetic field is oriented in the direction y. The magnetic resonance signal is therefore a signal that circulates in a plane that extends in the directions x, z. Accordingly, the antenna arrangement of FIG. 5 is fashioned such that it can acquire a magnetic resonance signal that essentially proceeds in a plane that extends parallel to the perineum element 5.

The acquisition of the component of the magnetic resonance signal in the direction x ensues in the same way as described above in conjunction with FIGS. 1 through 3. The acquisition of the component of the magnetic resonance signal in direction z ensues in the same way as described above in conjunction with FIG. 4. The phase-correct addition, such that only a signal polarized in the rotational sense but not a signal polarized opposite the rotational sense is acquired, likewise ensues as described above, particularly in conjunction with FIG. 2. Farther details about the functioning of the antenna arrangement 2 according to FIG. 5 are therefore not necessary.

In order to assure a good fit of the retainer structure 3 on the subject 1, the waistband 4 can have a variable circumference U. The variability of the circumference U can thereby be achieved, for example, by the waistband 4 being composed of elastic material—as indicated with a zigzag line in FIGS. 1, 4 and 5. Alternatively or additionally, for example, the waistband 4 can be fashioned so as to be adjustable. This is explained in detail below in conjunction with FIG. 6.

Figure 6:
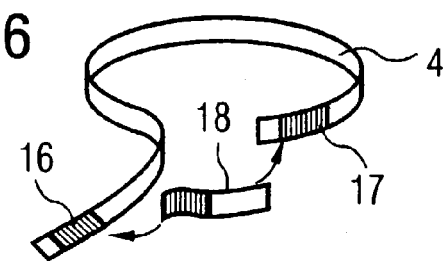
FIG. 6 illustrates a waistband of the inventive local coil arrangement.

According to FIG. 6, the waistband 4 (shown isolated in FIG. 6) has a retainer element 16 and a cooperating retainer element 17 respectively having parts of a (hook and loop) (Velcro®). The hook and loop fastener represents a separating location at which the waistband 4 can be separated without tools.

Typically, hook and loop fasteners have the property that they are adjustable with infinite variation. The circumference U can therefore be adapted as needed. As an alternative to providing the hook and loop fastener, of course, it would also be possible, for example, to fashion the waistband 4 like a belt, i.e. to provide a buckle and corresponding holes into which a tongue of the buckle can engage.

Due to the separability of the waistband 4 at the separating location, moreover, it is also possible to introduce a bridge element 18 into the waistband 4 and to thus lengthen the circumference U of the waistband 4 by introducing the bridge element 18.

The antenna arrangement 2 can be enveloped with liquid-tight material at least in the region of the perineum element 5, but preferably everywhere. In this case, interventional examinations of the pelvic region are also possible. Further, the antenna arrangement 2 and the retainer structure 3 preferably are composed of sterilizeable material. In particular, the retainer structure 3 can be composed of the aforementioned PE (polyurethane). In this case, the local coil arrangement L is reusable and can be autoclaved.

Exact examinations of the pelvic region are possible with the inventive local coil arrangement L in a way that is considerably simpler and more pleasant for the person 1. Of course, the inventive local coil arrangement L can be used together with other local coil arrangements, if necessary.

Although modifications and changes may be suggested by those skilled in the art, it is the intention of the inventors to embody within the patent warranted hereon all changes and modifications as reasonably and properly come within the scope of their contribution to the art.

We claim as our invention:

1. A local coil arrangement for a magnetic resonance system comprising:
   a flexible non-rigid retainer structure having a waistband;
   a flexible antenna arrangement built into said retainer structure, said antenna arrangement including a perineum element having a middle section;
   said retainer structure with said antenna arrangement built therein being configured to be donned by an examination subject as non-rigid apparel to bring said middle section of said perineum element adjacent the perineum of the subject with said perineum element extending from a front side of the perineum to a back side of the perineum; and
   said antenna arrangement comprising a conductor configuration selected from the group consisting of (a) a conductor forming a half loop comprising said perineum element and extending from said front side to said back side of the perineum, said half loop having two half-loop ends, and a single connecting ring attached to said ends and (b) a ring conductor connected to said perineum element configured to proceed around the subject substantially parallel to the waistband.

2. A local coil arrangement as claimed in claim 1 wherein said antenna arrangement comprises a perineum ring conductor extending from a first point on said waistband to said middle section of said perineum element at one side of said middle section.

3. A local coil arrangement as claimed in claim 2 wherein said antenna arrangement comprises a further ring conductor extending from said second point on said waistband opposite said first point, to an opposite side of said middle section, opposite to said one side of said middle section.

4. A local coil arrangement as claimed in claim 3 wherein said ring conductor and said auxiliary ring conductor form a single conductor loop which crosses itself in said middle section of said perineum element.

5. A local coil arrangement as claimed in claim 1 wherein said waistband has a variable circumference.

6. A local coil arrangement as claimed in claim 5 wherein said waistband is composed of elastic material.

7. A local coil arrangement as claimed in claim 5 wherein said waistband is manually adjustable in circumference.

8. A local coil arrangement as claimed in claim 7 wherein said waistband has a separating location bridged with a bridge element that is releasably connectable to said waistband.

9. A local coil arrangement as claimed in claim 1 wherein said perineum element of said antenna arrangement is enveloped with a liquid-tight material.

10. A local coil arrangement as claimed in claim 1 wherein said antenna arrangement is enveloped with a liquid-tight material.

11. A local coil arrangement as claimed in claim 1 wherein said antenna arrangement comprises a conductor configuration and circuit components connected to said conductor configuration which emit an antenna arrangement output signal, said conductor configuration and said circuit component being configured to acquire, as said output signal, a magnetic resonance signal that is circularly polarized in a rotational sense and to prevent acquisition of a magnetic resonance signal that is circularly polarized opposite to said rotational sense.

12. A local coil arrangement as claimed in claim 1 wherein said retainer structure and said antenna arrangement are composed of sterilizeable material.

* * * * *